US012610494B2

(12) United States Patent
Wang et al.

(10) Patent No.: US 12,610,494 B2
(45) Date of Patent: Apr. 21, 2026

(54) CHASSIS AND ELECTRONIC HOST

(71) Applicant: Fulian Precision Electronics (Tianjin) Co., LTD., Tianjin (CN)

(72) Inventors: Pao-Ching Wang, New Taipei (TW); Chieh-Hsiang Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 220 days.

(21) Appl. No.: 18/507,126

(22) Filed: Nov. 13, 2023

(65) Prior Publication Data

US 2024/0268054 A1 Aug. 8, 2024

(30) Foreign Application Priority Data

Feb. 2, 2023 (CN) .......................... 202310078043.0

(51) Int. Cl.
*H05K 7/14* (2006.01)
*G06F 1/185* (2026.01)
(Continued)

(52) U.S. Cl.
CPC .......... *H05K 7/1487* (2013.01); *G06F 1/185* (2013.01); *G06F 1/186* (2013.01); *H05K 5/0217* (2013.01); *H05K 7/14* (2013.01); *H05K 7/1402* (2013.01); *H05K 7/1409* (2013.01); *H05K 7/1489* (2013.01)

(58) Field of Classification Search
CPC ...... H05K 7/02; H05K 7/1402; H05K 7/1404; H05K 7/1405; H05K 7/1407; H05K 7/1408; H05K 7/1409; H05K 7/1411; H05K 7/1415; H05K 7/1418; H05K 7/1461; H05K 7/1487; H05K 7/1489; H05K 7/16; H05K 7/183; H05K 5/0221; H05K 5/023; H05K 5/0286; G06F 1/1658; G06F 1/1684; G06F 1/181; G06F 1/183; G06F 1/184; G06F 1/185; G06F 1/186; G06F 1/187; G06K 13/08; G06K 13/0806; G11B 33/123; G11B 33/127; G11B 33/128
See application file for complete search history.

(56) References Cited

U.S. PATENT DOCUMENTS 3,279,875 A * 10/1966 Witte, Jr. .............. B01F 27/092
312/333
5,481,431 A * 1/1996 Siahpolo ................ G11B 33/08
(Continued)

*Primary Examiner* — Gage Crum
(74) *Attorney, Agent, or Firm* — ScienBiziP, P.C.

(57) ABSTRACT

A chassis for holding electronic devices includes a main body, a guiding component, and a latching component. The main body defines a storage cavity with an upper layer and a lower layer, the upper layer can hold an electronic device, and the lower layer can hold another electronic device. The electronic devices can slide along the guiding component into or out of the storage cavity. The latching component have an upper handle and a lower handle, the upper handle can latch or unlatch the electronic device in the upper layer, and the lower handle can latch or unlatch the electronic device in the lower layer. An avoiding space is defined between the upper handle and the lower handle, the avoiding space is configured for providing a space to rotate the lower handle, so the lower handle never contacts the upper handle. An electronic host using the chassis is also disclosed.

14 Claims, 7 Drawing Sheets

100

(51) Int. Cl.
  G06F 1/186     (2026.01)
  H05K 5/02      (2006.01)

(56)            References Cited

U.S. PATENT DOCUMENTS

| | | | | |
|---|---|---|---|---|
| 5,588,728 | A * | 12/1996 | Eldridge | G11B 33/1493 |
| 5,641,296 | A * | 6/1997 | Larabell | H01R 13/62933 |
| 5,668,696 | A * | 9/1997 | Schmitt | G11B 33/127 |
| | | | | 439/928.1 |
| 5,765,933 | A * | 6/1998 | Paul | H01R 13/6335 |
| | | | | 439/157 |
| 5,828,548 | A * | 10/1998 | Chen | G11B 33/124 |
| 5,947,572 | A * | 9/1999 | Chang | G11B 33/122 |
| | | | | 439/484 |
| 6,003,689 | A * | 12/1999 | Babineau | H05K 7/1409 |
| | | | | 211/41.17 |
| 6,377,447 | B1 * | 4/2002 | Boe | G06F 1/187 |
| | | | | 361/829 |
| 6,421,252 | B1 * | 7/2002 | White | H05K 7/1429 |
| | | | | 361/801 |
| 6,464,085 | B1 * | 10/2002 | Chin | G11B 33/128 |
| 6,616,106 | B1 * | 9/2003 | Dean | G06F 1/184 |
| 6,619,766 | B1 * | 9/2003 | Mansueto | G06F 1/184 |
| | | | | 312/333 |
| 6,654,240 | B1 * | 11/2003 | Tseng | G06F 1/184 |
| | | | | 361/679.33 |
| 6,739,890 | B2 * | 5/2004 | Hirata | G06K 13/0806 |
| | | | | 439/159 |
| 6,771,496 | B1 * | 8/2004 | Wu | G06F 1/187 |
| | | | | 108/109 |
| 7,318,531 | B2 * | 1/2008 | Wu | G11B 33/128 |
| 7,344,394 | B1 * | 3/2008 | Barina | G06F 1/183 |
| | | | | 361/755 |
| 7,400,936 | B2 * | 7/2008 | Chang | G11B 33/022 |
| 7,639,492 | B2 * | 12/2009 | Thomas | G11B 33/1493 |
| | | | | 361/679.33 |
| 8,111,509 | B2 * | 2/2012 | Lee | G06F 1/181 |
| | | | | 361/679.33 |
| 9,030,819 | B2 * | 5/2015 | He | G11B 33/124 |
| | | | | 248/222.51 |
| 9,395,766 | B2 * | 7/2016 | Mau | G11B 33/122 |
| 9,443,559 | B2 * | 9/2016 | Jau | G11B 33/022 |
| 10,353,444 | B1 * | 7/2019 | Liu | G06F 1/187 |
| 10,863,647 | B1 | 12/2020 | Escamilla et al. | |
| 2003/0155471 | A1 * | 8/2003 | Dean | G11B 33/128 |
| 2005/0121581 | A1 * | 6/2005 | Chen | G06F 1/184 |
| 2008/0158810 | A1 * | 7/2008 | Liu | G06F 1/187 |
| 2008/0259554 | A1 * | 10/2008 | Qin | G06F 1/187 |
| | | | | 361/679.34 |
| 2008/0298005 | A1 * | 12/2008 | Deng | G06F 1/187 |
| | | | | 361/825 |
| 2011/0032665 | A1 * | 2/2011 | Huang | G06F 1/187 |
| | | | | 361/679.01 |
| 2011/0267766 | A1 * | 11/2011 | Wu | G06F 1/187 |
| | | | | 361/679.37 |
| 2011/0289521 | A1 * | 11/2011 | Chen | G11B 33/124 |
| 2013/0032687 | A1 * | 2/2013 | Zhang | G06F 1/187 |
| | | | | 248/544 |
| 2014/0016263 | A1 * | 1/2014 | Chang | G06F 1/187 |
| | | | | 361/679.37 |
| 2021/0132667 | A1 * | 5/2021 | Wong | G06F 1/183 |
| 2023/0133801 | A1 * | 5/2023 | Liu | H05K 7/1487 |
| | | | | 361/679.01 |
| 2023/0225072 | A1 * | 7/2023 | Zhong | H05K 7/1401 |
| | | | | 211/26.2 |

* cited by examiner

300

100

100

CHASSIS AND ELECTRONIC HOST

FIELD

The disclosure herein generally relates to information handling systems, and more particularly relates to a chassis and an electronic host.

BACKGROUND

The expansion cards installed on the motherboard usually stay in a standard height of 1U in total and in two layers, if the expansion card on the lower layer needs to be taken out, it is necessary to remove the expansion card on the upper layer first, and then the expansion card on the lower layer can be taken out, but such a sequence will lead to low efficiency in installing and disassembling of expansion cards.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
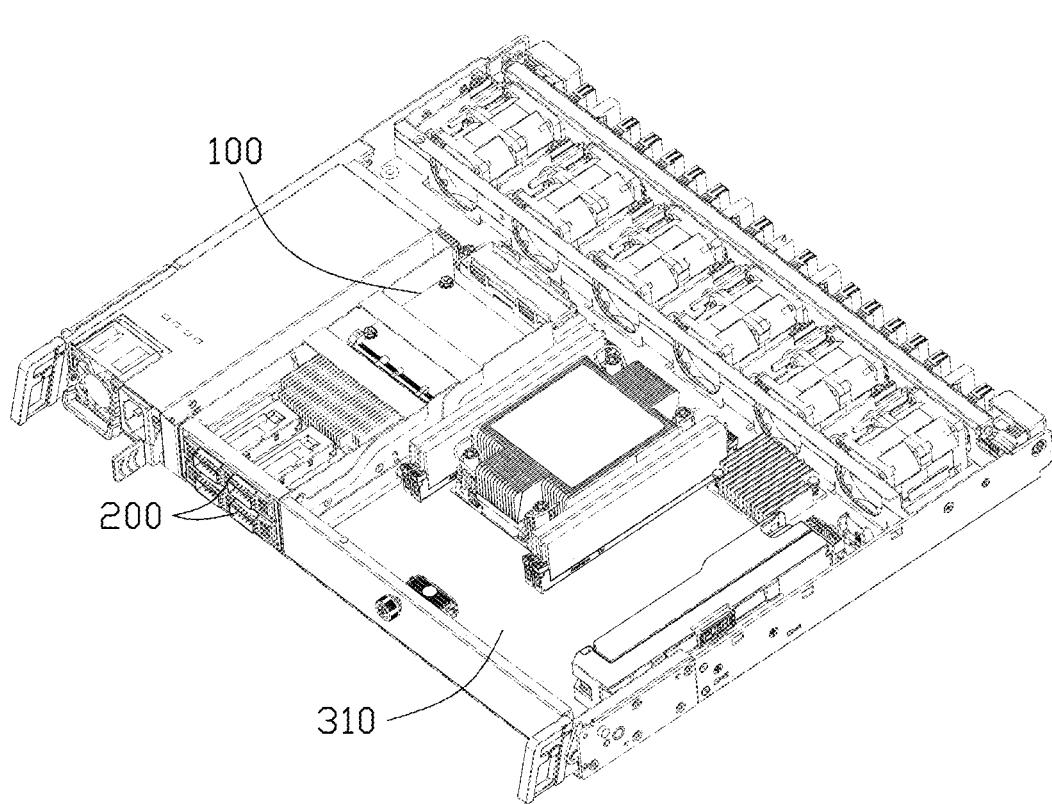
FIG. 1 is an isometric view illustrating an electronic host according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "comprising" means "including, but not necessarily limited to;" it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1 to FIG. 7, a chassis 100 for holding two electronic devices 200 in an embodiment includes a main body 10, a guiding component 20, and a latching component 30. The main body 10 includes a bottom wall 11 and two side walls 12. The two side walls 12 are perpendicular to the bottom wall 11. The two side walls 12 are parallel and are located on two opposite sides of the bottom wall 11. The bottom wall 11 and the two side walls 12 form a storage cavity 14 with an opening 13. Each of the two electronic devices 200 is movable into or out of the storage cavity 13 through the opening 13. The storage cavity 13 is used for holding the two electronic devices 200. The storage cavity 13 defines an upper layer and a lower layer. The upper layer is above the lower layer. The upper layer is configured for holding one of the two electronic devices 200, and the lower layer is configured for holding another one of the two electronic devices 200.

The guiding component 20 includes an upper rail set and a lower rail set. The upper rail set includes two upper rails 21, and the lower rail set includes two lower rail 22. The two upper rails 21 and the two lower rails 22 are located on the side wall 12 and are parallel to the bottom wall 11. Each of the two of upper rails 21 is located on each of the two side walls 12, and each of the two lower rails 22 is located on each of the two side walls 12. The two lower rails 22 is located between the two upper rails 21 and the bottom wall 11, and the two upper rails 21 is above the two lower rails 22. The two upper rails 21 are placed in the upper layer, and the two lower rails 22 are placed in the lower layer. Each of the two electronic devices 200 is slidable along the two upper rails 21 or the two lower rails 22. When one of the two electronic devices 200 slides along the two upper rails 21 into the storage cavity 13, the one of the two electronic devices 200 is in the upper layer. When one of the two electronic devices 200 slides along the two lower rails 22 into the storage cavity 13, the one of the two electronic devices 200 is in the lower layer.

The latching component 30 includes an upper handle 31 and a lower handle 32. The upper handle 31 and the lower handle 32 is rotatably connected to the two side walls 12. When the upper handle 31 is pushed down, the upper handle 31 latches the electronic device 200 in the upper layer to position the electronic device 200 in the upper layer, and when the upper handle 31 is pulled up, the upper handle 31 unlatches the electronic device 200 in the upper layer, so the electronic device 200 in the upper layer can be removed. When the lower handle 32 is pushed down, the lower handle 32 latches the electronic device 200 in the lower layer to position the electronic device 200 in the lower layer, and when the lower handle 32 is pulled up, the lower handle 32 unlatches the electronic device 200 in the lower layer, so the electronic device 200 in the lower layer can be removed.

Thus, when the electronic device 200 in the lower layer needs to be removed, it is not necessary to remove the electronic device 200 in the upper layer first, so the electronic device 200 in the lower layer can be removed easily, improving efficiency of installing and removing the electronic device 200.

For example, each of the two electronic devices 200 is an expansion card component, and each of the two expansion card components includes two expansion cards. The chassis can connect the four expansion cards to an electronic host, such as a computer, and each of the four expansion cards can provide an additional feature to the electronic host.

Figure 3:
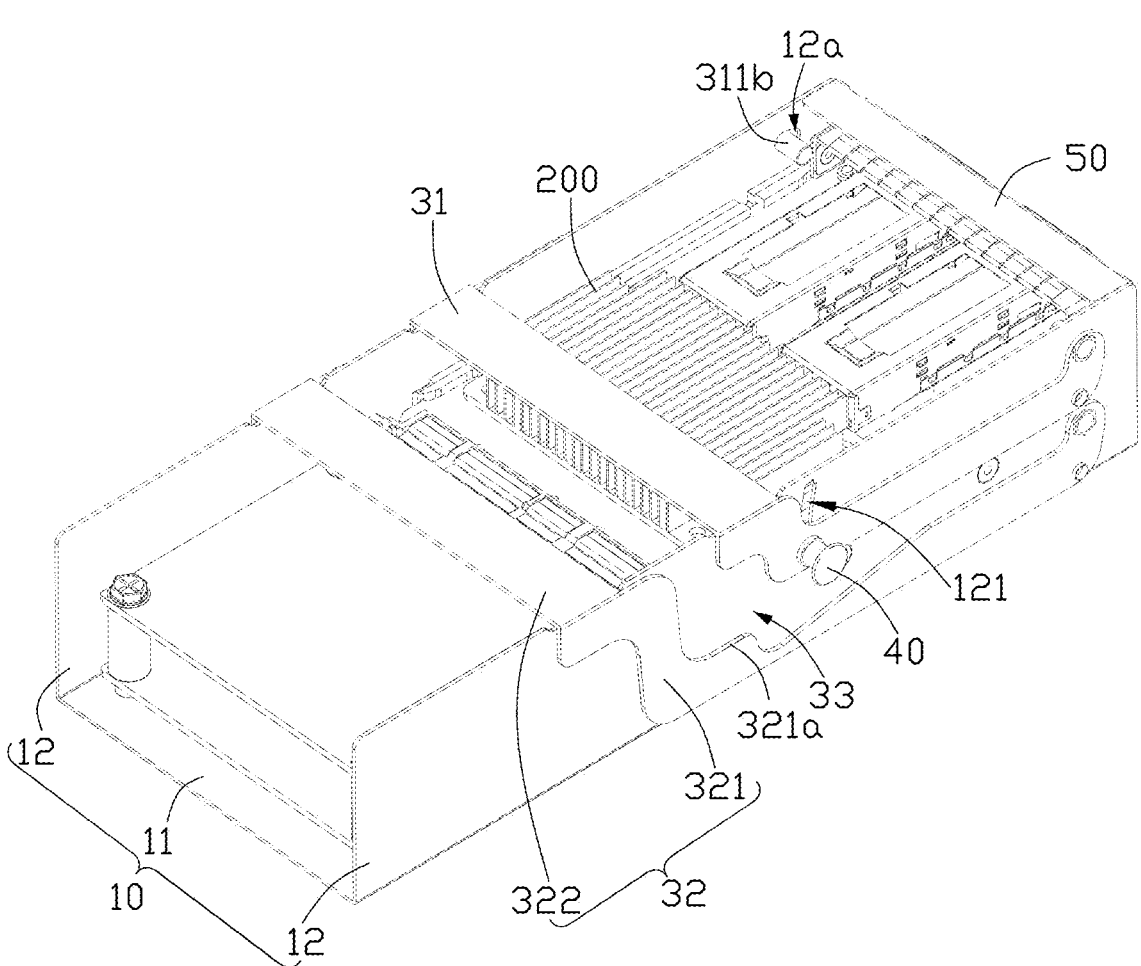
FIG. 3 is another isometric view illustrating the chassis holding the electronic devices within in FIG. 2.
Figure 4:
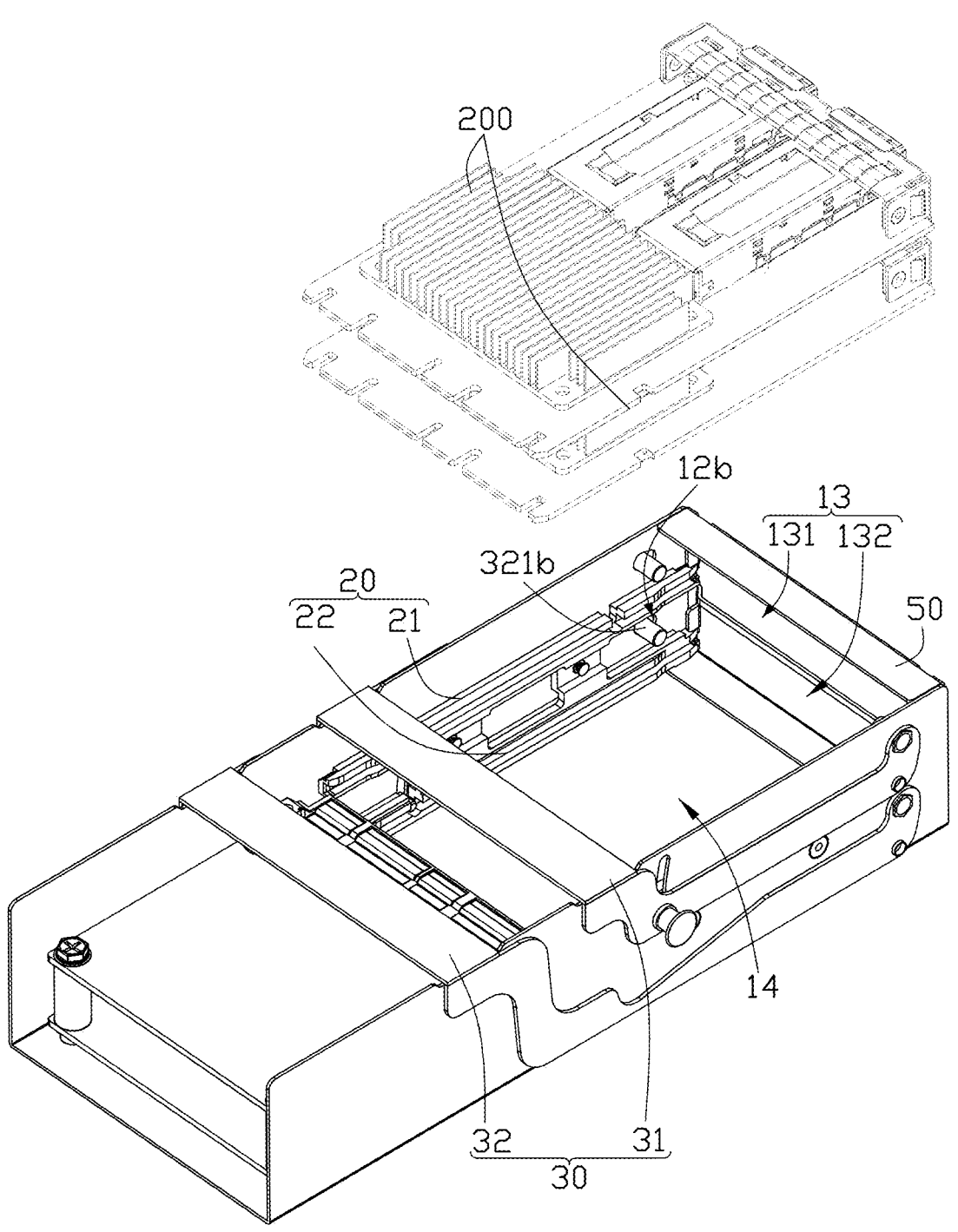
FIG. 4 is an exploded view illustrating the chassis and the electronic devices in FIG. 2.
Figure 7:
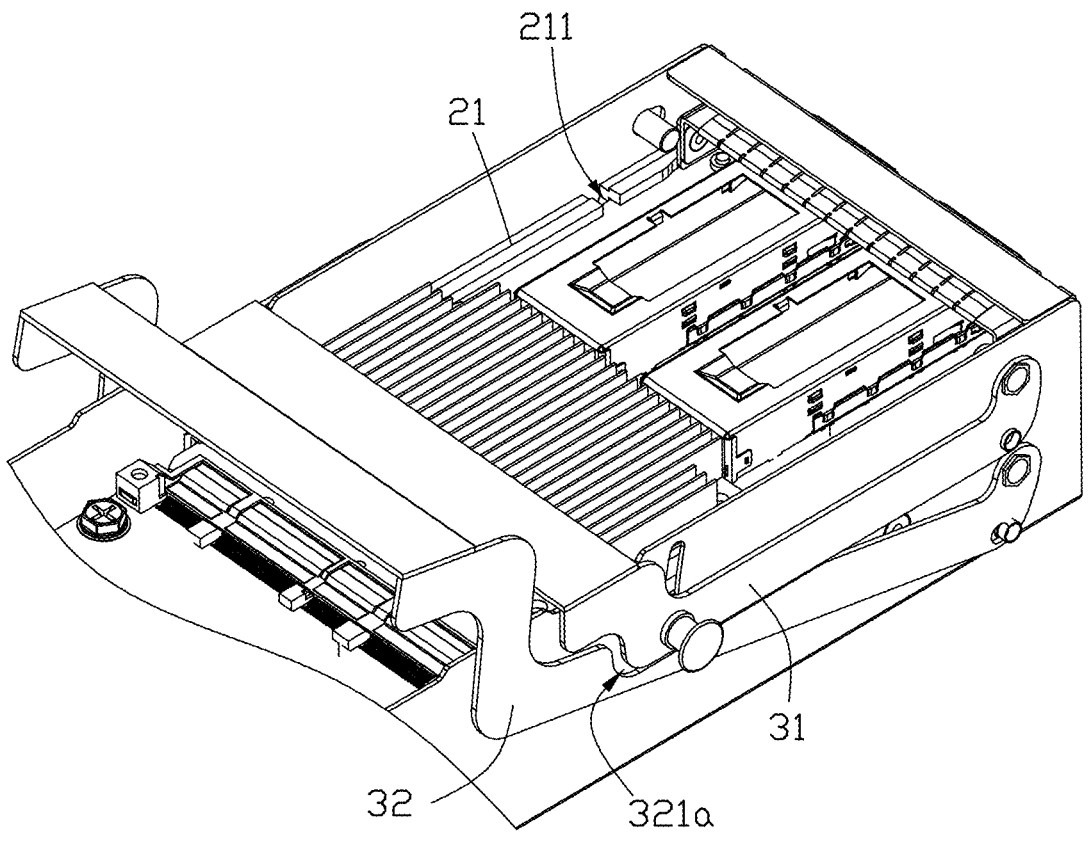
FIG. 7 is a partially isometric view illustrating the chassis when a lower handle is pulled up in FIG. 2.

In some embodiments, an avoiding space 33 is defined between the upper handle 31 and the lower handle 32, as shown in FIG. 3 and FIG. 7, when the lower handle 32 is pulled up, the avoiding space is used for providing enough space to rotate for the lower handle 32, so the lower handle 32 never contact the upper handle 31.

In some embodiments, the upper handle 31 includes two upper swivel arms 311 and an upper connecting arm 312. Each of the two upper swivel arms 311 is rotatably connected to each of the two side walls 12. The upper connecting arm 312 is connected between the two upper swivel arms 311, and the upper connecting arm 312 is above the two side walls 12. The upper connecting arm 312 is used to be held for a user. When the user pushes the upper handle 31 down until the upper connecting arm 312 contact the two side walls 12, the upper handle 31 can latch the electronic device 200 in the upper layer. When the user pulls the upper handle 31 up, the upper handle 31 unlatches the electronic device 200 in the upper layer.

The lower handle 32 includes two lower swivel arms 321 and a lower connecting arm 322. Each of the two lower swivel arms 321 is rotatably connected to each of the two side walls 12. The lower connecting arm 322 is connected between the two lower swivel arms 321, and the lower connecting arm 322 is above the two side walls 12. The lower connecting arm 322 is used to be held for a user. When the user pushes the lower handle 32 down until the lower connecting arm 322 contact the two side walls 12, the lower handle 32 can latch the electronic device 200 in the lower layer. When the user pulls the lower handle 32 up, the lower handle 32 unlatches the electronic device 200 in the lower layer.

The two lower swivel arms 321 are located below the two upper swivel arms 311, and the avoiding space 33 is formed between each of the two upper swivel arms 311 and each of the two lower swivel arms 321, so the two lower swivel arms 321 never contact the two upper swivel arms 311.

Figure 2:
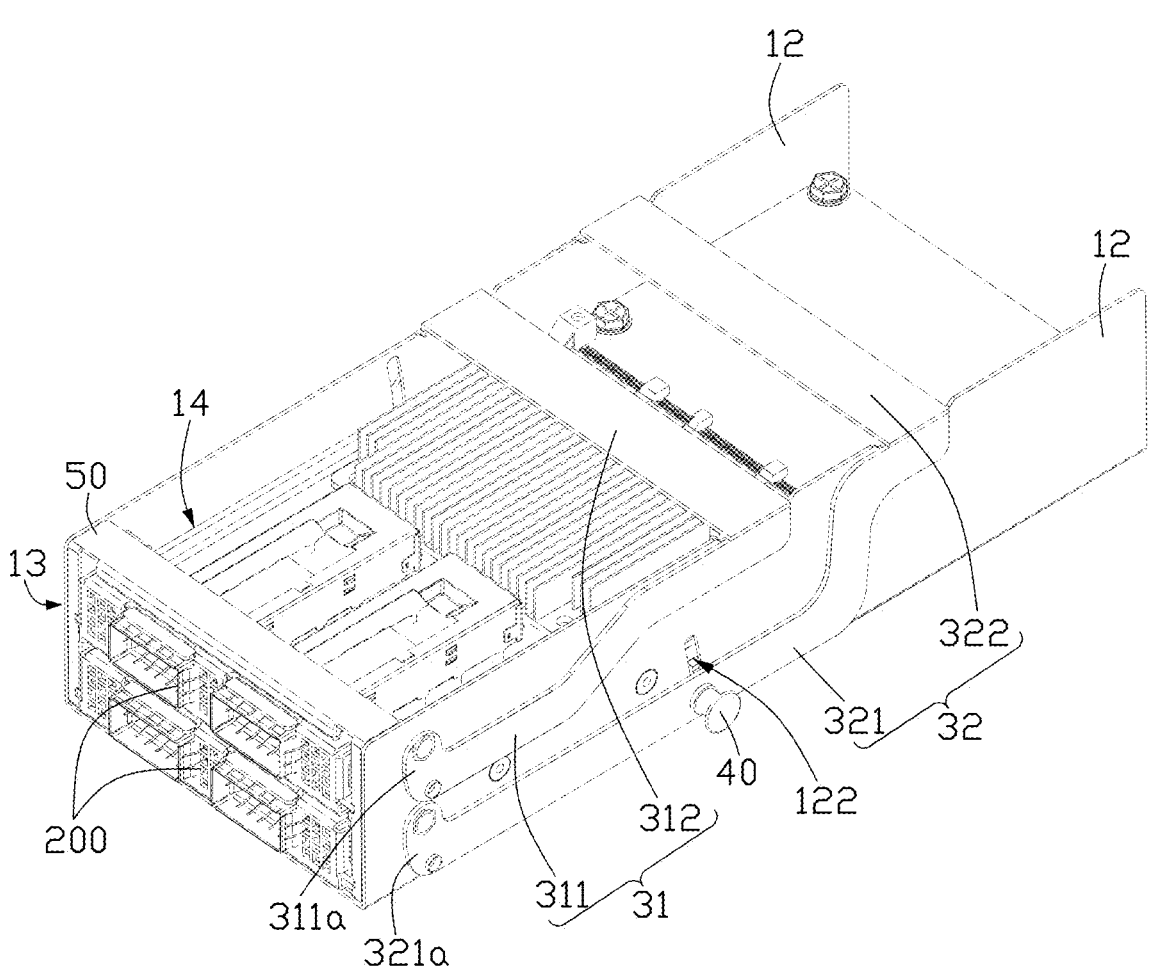
FIG. 2 is an isometric view illustrating a chassis holding electronic devices within according to an embodiment of the present disclosure.

In some embodiments, one of the two side walls 12 defines an upper arc groove 121, as shown in FIG. 3, another one of the two side walls 12 defines a lower arc groove 122, as shown in FIG. 2. One of the two upper swivel arms 311 has a first pin 40, as shown in FIG. 3. One of the two lower swivel arms 321 has a second pin 40, as shown in FIG. 2, and the construction of the second pin 40 is same as first pin 40. The first pin 40 is slidably inserted in the upper arc groove 121. The second pin 40 is slidably inserted in the lower arc groove 122. The upper arc groove 121 is used for limiting the rotation of the upper handle 31. The lower arc groove 321 is used for limiting the rotation of the lower handle 32.

In some embodiments, one of the two upper rails 21 defines an upper positioning slot 211, and the upper positioning slot 211 is connected to the upper arc groove 121. one of the two lower rails 22 defines a lower positioning slot 221, and the lower positioning slot 221 is connected to the lower arc groove 122. One side of each of the two electronic devices 200 defines a positioning groove 210.

Figure 5:
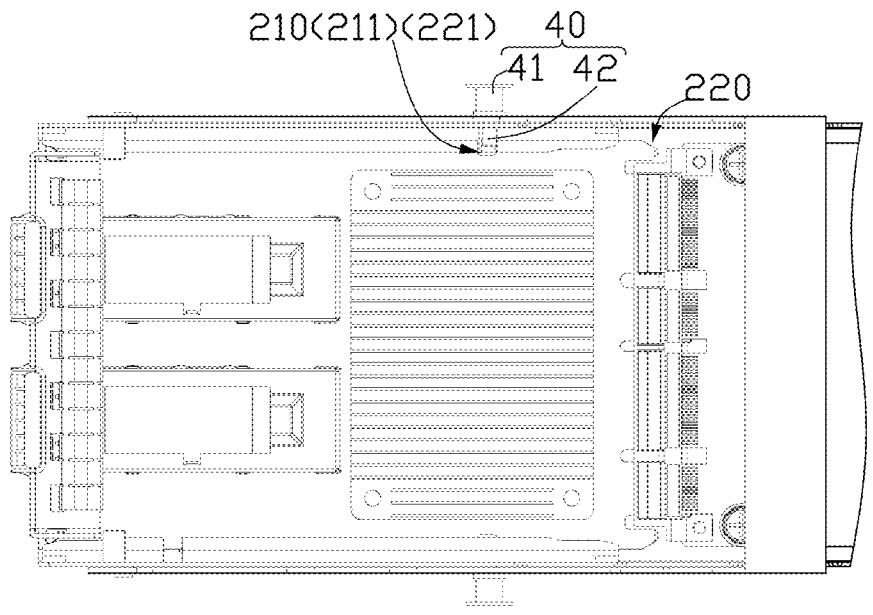
FIG. 5 is a top view illustrating the chassis holding the electronic devices within in FIG. 2.
Figure 6:
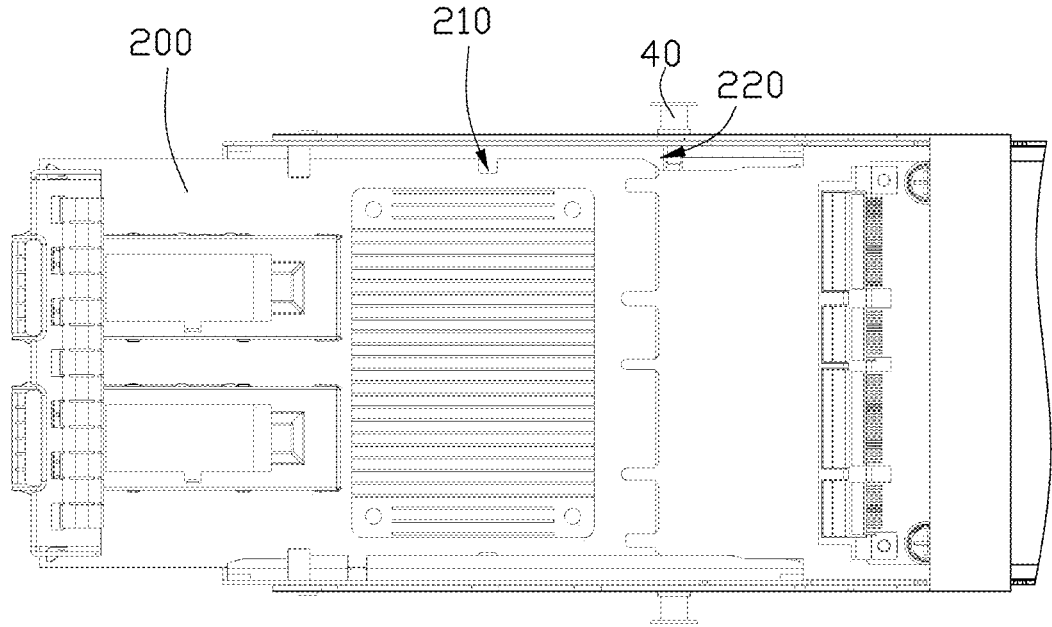
FIG. 6 is a top view illustrating the chassis and the electronic devices being removed in FIG. 2.

As shown in FIG. 5 and FIG. 6, the construction of the first pin 40 and the second pin are the same, and the first pin 40 includes a fixed part 41, a moving part 42, and a spring (not shown in figures). The fixed part 41 is fixed on the upper swivel arm 311. The moving part 42 is connected to the fixed part 41 through the spring. Each of the two electronic devices 200 has a bevel 220.

When one of the two the electronic devices 200 slides along the two upper rails 21 into the storage cavity 14, the upper handle 31 needs to be pushed down until the upper connecting arm 312 contacts the two side walls 12, so the positioning groove 210 is aligned with the upper positioning slot 211. During the sliding of the electronic devices 200, the bevel 220 pushes the moving part 42 to move towards the fixed part 41, meanwhile the spring is compressed, until the moving part 42 is aligned with the positioning groove 210 and the upper positioning slot 211, the spring pushes the moving part 42 to insert into the positioning groove 210 and the upper positioning slot 211, so to position the electronic device 200 in the upper layer.

When one of the two the electronic devices 200 slides along the two lower rails 22 into the storage cavity 14, the lower handle 32 needs to be pushed down until the lower connecting arm 322 contacts the two side walls 12, so the positioning groove 210 is aligned with the lower positioning slot 221. During the sliding of the electronic devices 200, the bevel 220 pushes the moving part 42 to move towards the fixed part 41, meanwhile the spring is compressed, until the moving part 42 is aligned with the positioning groove 210 and the lower positioning slot 221, the spring pushes the moving part 42 to insert into the positioning groove 210 and the lower positioning slot 221, so to position the electronic device 200 in the lower layer.

Thus, when inserting the electronic device 200 into the chassis 100, it is not necessary to lift the upper handle 31 or the lower handle 32, which improving the efficiency of installing.

In some embodiments, each of the two side walls 12 defines an upper push-out slot 12a and a lower push-out slot 12b. Each of the two upper swivel arms 311 has an upper extension part 311a, and the upper extension part 311a has an upper pushing rod 311b in the upper push-out slot 12a. Each of the two lower swivel arms 321 has a lower extension part 321a, and the lower extension part 321a has a lower pushing rod 321b in the lower push-out slot 12b.

When the upper handle 31 is pulled up, the upper pushing rod 311b slides along the upper push-out slot 12a and pushes the electronic device 200 in the upper layer outwards, so it is easier for the user to remove the electronic device 200 in the upper layer. When the lower handle 32 is pulled up, the lower pushing rob 321b slides along the lower push-out slot 12b and pushes the electronic device 200 in the lower layer outwards, so it is easier for the user to remove the electronic device 200 in the lower layer.

The axis of the upper handle 31 and the axis of the lower handle 32 relative to the main body 10 are parallel, and a plane where the axis of the upper handle 31 and the axis of the lower handle 32 lie is perpendicular to the bottom wall 11, so the upper pushing rod 311b and the lower pushing rob 321b push the same position of the electronic device 200.

In some embodiments, as shown in FIG. 3 and FIG. 7, the lower swivel arm 321 has a profile surface 321c, and a shape of the profile surface 321c is same as a shape of one of the two upper swivel arms 311, so to form the avoiding space 33 between the profile surface 321c and the upper swivel arm 311.

In some embodiments, the chassis 10 further has a frame 50 at the opening 13. The frame 50 is located on the bottom wall 11 and the two side walls 12, and the frame 50 separates the opening 13 into an upper entrance 131 and a lower entrance 132. The upper entrance 131 is connected to the upper layer, and the lower entrance 132 is connected to the lower layer. The upper entrance 131 is used for guiding each of the two electronic devices 200 to insert into the upper layer, and the lower entrance 132 is used for guiding each of the two electronic devices 200 to insert into the lower layer.

In some embodiments, a height of the chassis 100 perpendicular to the bottom wall 11 is less than or equal to 1U (1U=4.445 cm).

In some embodiments, the height of the chassis 100 can be larger than 1U, and the chassis 100 can have more than two layers to hold more than two electronic devices 200.

As shown in FIG. 1, an electronic host 300 in one embodiment includes a mother board 310, two expansion card components 200, and the chassis 100. Each of the two expansion card components 200 includes two expansion cards. The bottom wall 11 is located on the mother board 310. The storage cavity 14 can hold the four expansion cards. When the expansion card components 200 are installed in the storage cavity 14, the expansion cards are connected to the mother board 310.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A chassis for holding electronic devices comprising:
a main body defining a storage cavity with an opening, wherein the storage cavity defines an upper layer and a lower layer, the upper layer is configured for holding an electronic device, and the lower layer is configured for holding another electronic device;
a guiding component comprising a upper rail set and a lower rail set connected to the main body, wherein the upper rail set is located in the upper layer, and the lower rail set is located in the lower layer, the electronic device of the upper layer is slidable along the upper rail set into or out of the storage cavity through the opening, the other electronic device of the lower layer is slidable along the lower rail set into or out of the storage cavity through the opening; and
a latching component comprising an upper handle and a lower handle connected to the main body, wherein when the upper handle is pushed down, the upper handle latches the electronic device in the upper layer, and when the upper handle is pulled up, the upper handle unlatches the electronic device in the upper layer, when the lower handle is pushed down, the lower handle latches the other electronic device in the lower layer, and when the lower handle is pulled up, the lower handle unlatches the other electronic device in the lower layer, an avoiding space is defined between the upper handle and the lower handle, the avoiding space is configured for providing a space to rotate for the lower handle;
the main body comprises a bottom wall and two side walls, the two side walls are perpendicular to the bottom wall, the two side walls are parallel to each other and are located on two opposite sides of the bottom wall, the storage cavity and the opening are formed between the bottom wall and the two side walls, the lower layer is located between the upper layer and the bottom wall;
the upper rail set comprises two upper rails, the lower rail set comprises two lower rails, the two upper rails and the two lower rails are parallel to the bottom wall, each of the two upper rails is located on each of the two side walls, each of the two lower rails is located on each of the two side walls, the electronic device of the upper layer is slidable along the two upper rails, the other electronic device of the lower layer is slidable along the two lower rails;
the upper handle comprises two upper swivel arms and an upper connecting arm, each of the two upper swivel arms are rotatably connected to each of the two side walls, the upper connecting arm is connected between the two upper swivel arms and is located above the two side walls, when the upper handle is pushed down until the upper connecting arm contacts the two side walls, the electronic device in the upper layer is latched, and
the lower handle comprises two lower swivel arms and a lower connecting arm, each of the two lower swivel arms are rotatably connected to each of the two side walls, the lower connecting arm is connected between the two lower swivel arms and is located above the two side walls, when the lower handle is pushed down until the lower connecting arm contacts the two side walls, the other electronic device in the lower layer is latched.

2. The chassis of claim 1, wherein one of the two side walls defines an upper arc groove, another one of the two side walls defines a lower arc groove, one of the two upper swivel arms comprises a first pin, one of the two lower swivel arms comprises a second pin, the first pin is slidably inserted in the upper arc groove, the second pin is slidably inserted in the lower arc groove, the upper arc groove limits a rotation of the upper handle, and the lower arc groove limits a rotation of the lower handle.

3. The chassis of claim 2, wherein each of the electronic device and the other electronic device defines a positioning groove, one of the two upper rails defines an upper positioning slot, the upper positioning slot is connected to the upper arc groove, one of the two lower rails defines a lower positioning slot, the lower positioning slot is connected to the lower arc groove, when the upper handle is pushed down until the upper connecting arm contacts the two side walls, the first pin inserts the upper positioning slot and the positioning groove of the electronic device in the upper layer to position the electronic device in the upper layer, and
when the lower handle is pushed down until the lower connecting arm contacts the two side walls, the second pin inserts the lower positioning slot and the positioning groove of the other electronic device in the lower layer to position the electronic device in the lower layer.

4. The chassis of claim 3, wherein the first pin comprises a fixed part, a moving part, and a spring, the fixed part is located on one of the two upper swivel arms, the moving part connects the fixed part through the spring, an inner end of each of the electronic device and the other electronic device defines a bevel, when one of the electronic device and the other electronic device slides into the upper layer, the bevel pushes the moving part and the spring is compressed, and when the moving part is aligned with the positioning groove, the spring pushes the moving part into the positioning groove to position the electronic device in the upper layer.

5. The chassis of claim 1, wherein each of the two side walls defines an upper push-out slot, each of the two upper swivel arms comprises an upper extension part and an upper pushing rod, each of the two upper pushing rods is connected to each of the two upper extension parts, each of the two upper pushing rods is slidably inserted in each of the two upper push-out slots, when the upper handle is pulled up, the two upper pushing rods pushes the electronic device in the upper layer outwards, and each of the two side walls further defines a lower push-out slot, each of the two lower swivel arms comprises a lower extension part and a lower pushing rod, each of the two lower pushing rods is connected to each of the two lower extension parts, each of the two lower pushing rods is slidably inserted in each of the two lower push-out slots, when the lower handle is pulled up, the two lower pushing rods pushes the other electronic device in the lower layer outwards.

6. The chassis of claim 1, wherein one of the two lower swivel arms defines a profile surface, a shape of the profile surface is same as a shape of one of the two upper swivel arms.

7. The chassis of claim 1, further comprising:

a frame at the opening, wherein the frame is connected to the bottom wall and the two side walls, the frame separates the opening into an upper entrance and a lower entrance, the upper entrance is connected to the upper layer, the lower entrance is connected to the lower layer.

8. An electronic host comprising:

a mother board;

two expansion card components, wherein each of the two expansion card components comprises a plurality of expansion cards; and a chassis comprising:

a main body defining a storage cavity with an opening, wherein the storage cavity defines an upper layer and a lower layer, the upper layer is configured for holding an expansion card component of the two expansion card components, and the lower layer is configured for holding another expansion card component of the two expansion card components;

a guiding component comprising a upper rail set and a lower rail set connected to the main body, wherein the upper rail set is located in the upper layer, and the lower rail set is located in the lower layer, the expansion card component of the upper layer is slidable along the upper rail set into or out of the storage cavity through the opening, the other expansion card component of the lower layer is slidable along the lower rail set into or out of the storage cavity through the opening; and a latching component comprising an upper handle and a lower handle connected to the main body, wherein when the upper handle is pushed down, the upper handle latches the expansion card component in the upper layer, to connect the expansion card component in the upper layer to the motherboard, and when the upper handle is pulled up, the upper handle unlatches the expansion card component in the upper layer, when the lower handle is pushed down, the lower handle latches the expansion card component in the lower layer, to connect the other expansion card component in the lower layer to the motherboard, and when the lower handle is pulled up, the lower handle unlatches the other expansion card component in the lower layer, an avoiding space is defined between the upper handle and the lower handle, the avoiding space is configured for providing a space to rotate for the lower handle;

the main body comprises a bottom wall and two side walls, the two side walls are perpendicular to the bottom wall, the two side walls are parallel to each other and are located on two opposite sides of the bottom wall, the storage cavity and the opening are formed between the bottom wall and the two side walls, the lower layer is located between the upper layer and the bottom wall;

the upper rail set comprises two upper rails, the lower rail set comprises two lower rails, the two upper rails and the two lower rails are parallel to the bottom wall, each of the two upper rails is located on each of the two side walls, each of the two lower rails is located on each of the two side walls, the expansion card component of the upper layer is slidable along the two upper rails, the other expansion card component of the lower layer is slidable along the two lower rails;

the upper handle comprises two upper swivel arms and an upper connecting arm, each of the two upper swivel arms are rotatably connected to each of the two side walls, the upper connecting arm is connected between the two upper swivel arms and is located above the two side walls, when the upper handle is pushed down until the upper connecting arm contacts the two side walls, the expansion card component in the upper layer is latched, and the lower handle comprises two lower swivel arms and a lower connecting arm, each of the two lower swivel arms are rotatably connected to each of the two side walls, the lower connecting arm is connected between the two lower swivel arms and is located above the two side walls, when the lower handle is pushed down until the lower connecting arm contacts the two side walls, the other expansion card component in the lower layer is latched.

9. The electronic host of claim 8, wherein one of the two side walls defines an upper arc groove, another one of the two side walls defines a lower arc groove, one of the two upper swivel arms comprises a first pin, one of the two lower swivel arms comprises a second pin, the first pin is slidably inserted in the upper arc groove, the second pin is slidably inserted in the lower arc groove, the upper arc groove limits a rotation of the upper handle, and the lower arc groove limits the rotation of the lower handle.

10. The electronic host of claim 9, wherein each of the expansion card component and the other expansion card component defines a positioning groove, one of the two upper rails defines an upper positioning slot, the upper positioning slot is connected to the upper arc groove, one of the two lower rails defines a lower positioning slot, the lower positioning slot is connected to the lower arc groove, when the upper handle is pushed down until the upper connecting arm contacts the two side walls, the first pin inserts the upper positioning slot and the positioning groove of the expansion card component in the upper layer, to position the expansion card component in the upper layer, and when the lower handle is pushed down until the lower connecting arm contacts the two side walls, the second pin inserts the lower positioning slot and the positioning groove of the expansion card component in the lower layer, to position the expansion card component in the lower layer.

11. The electronic host of claim 10, wherein the first pin comprises a fixed part, a moving part and a spring, the fixed part is located on one of the two upper swivel arms, the moving part connects the fixed part through the spring, an inner end of each of the expansion card component and the other expansion card component defines a bevel, when one of the expansion card component and the other expansion card component slides into the upper layer, the bevel pushes the moving part and the spring is compressed, and when the moving part is aligned with the positioning groove, the spring pushes the moving part into the positioning groove, to position the expansion card component in the upper layer.

12. The electronic host of claim 8, wherein each of the two side walls defines an upper push-out slot, each of the two upper swivel arms comprises an upper extension part and an upper pushing rod, each of the two upper pushing rods is connected to each of the two upper extension parts, each of the two upper pushing rods is slidably inserted in each of the two upper push-out slots, when the upper handle is pulled up, the two upper pushing rods pushes the expansion card component in the upper layer outwards, and each of the two side walls further defines a lower push-out slot, each of the two lower swivel arms comprises a lower extension part and a lower pushing rod, each of the two lower pushing rods is connected to each of the two lower extension parts, each of the two lower pushing rods is slidably inserted in each of the two lower push-out slots, when the lower handle is pulled up, the two lower pushing rods pushes the other expansion card component in the lower layer outwards.

13. The electronic host of claim 8, wherein one of the two lower swivel arms defines a profile surface, a shape of the profile surface is same as a shape of one of the two upper swivel arms.

14. The electronic host of claim 8, further comprising:
a frame at the opening, wherein the frame is connected to the bottom wall and the two side walls, the frame separates the opening into an upper entrance and a lower entrance, the upper entrance is connected to the upper layer, the lower entrance is connected to the lower layer.

* * * * *